United States Patent [19]

Hoffmann et al.

[11] Patent Number: 4,576,898

[45] Date of Patent: Mar. 18, 1986

[54] PROCESS OF MAKING PHOTOPOLYMER RELIEF PLATES USING AN ADHESIVE LAYER

[75] Inventors: Gerhard Hoffmann, Otterstadt; Dieter Kleuser, Frankenthal; Werner Lenz, Bad Durkheim, all of Fed. Rep. of Germany

[73] Assignee: BASF Aktiengesellschaft, Fed. Rep. of Germany

[21] Appl. No.: 658,463

[22] Filed: Oct. 9, 1984

Related U.S. Application Data

[60] Division of Ser. No. 465,996, Feb. 11, 1983, abandoned, which is a continuation of Ser. No. 310,403, Oct. 9, 1981, abandoned.

[30] Foreign Application Priority Data

Oct. 17, 1980 [DE] Fed. Rep. of Germany ....... 3039209

[51] Int. Cl.$^4$ ................................................ G03C 7/02
[52] U.S. Cl. ..................................... 430/306; 430/271; 430/281; 430/300
[58] Field of Search ............... 430/271, 281, 300, 306, 430/395

[56] References Cited

U.S. PATENT DOCUMENTS 4,053,317 10/1977 Naka et al. .......................... 430/281
4,289,843 9/1981 Boutle et al. ........................ 430/281
4,315,066 2/1982 Lambert ............................. 430/281

Primary Examiner—Jack P. Brammer
Attorney, Agent, or Firm—Keil & Weinkauf

[57] ABSTRACT

Photopolymer relief plates are produced by applying a photopolymerizable relief-forming layer R, which contains a thermal polymerization inhibitor liberating nitrosyl free radicals on ultraviolet irradiation, to a dimensionally stable base which bears an adhesive layer A for the layer R, the layer A containing 0.01 to 10 percent by weight of a compound

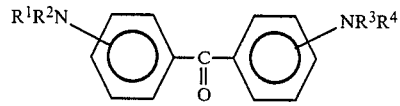

where $R^1$, $R^2$, $R^3$ and $R^4$ are identical or different and each is alkyl or $R^5$—(O-alkylene)$_x$—, $R^5$ being H or alkyl and x being 1, 2, 3, 4 or 5, and then exposing, and developing, the layer R in a conventional manner.

9 Claims, No Drawings

PROCESS OF MAKING PHOTOPOLYMER RELIEF PLATES USING AN ADHESIVE LAYER

This application is a division of application Ser. No. 465,966, filed on Feb. 11, 1983, which is a continuation of Ser. No. 310,403 filed Oct. 9, 1981 now abandoned.

The present invention relates to a process for the production of photopolymer relief plates by applying a layer of a mixture of photopolymerizable compound, a photoinitiator and a polymerization inhibitor to a base provided with a special adhesive layer, exposing the applied layer imagewise, and removing the unexposed areas of the layer.

The production of photopolymer relief plates by imagewise exposure of photocrosslinkable layers applied to a base bearing an adhesive layer is known per se; the photocrosslinkable layers can be solid or liquid. The manufacture of printing plates, using liquid, photocrosslinkable layers, is described, for example, in German Laid-Open Applications DOS Nos. 2,040,390, 2,316,401, 2,408,748, 2,414,596, 2,415,728 and 2,659,699. Moreover, 2,414,596 and 2,415,728 disclose applying the relief-forming, photocrosslinkable or photopolymerizable layer to bases which have beforehand been provided with one or more special adhesive layers. In producing such photopolymer relief plates by imagewise exposure of photocrosslinkable layers with ultraviolet light which includes a certain proportion of scattered light, it is found that the resulting relief image of the developed photopolymer printing plates is frequently unsatisfactory. It has been found that the exposure tolerance of such plates, i.e. the difference between the longest and shortest exposure times which give a satisfactory relief image, depends on the thickness of the relief-forming layer R (ie. on the relief height) and on the history of the photocrosslinkable mixture applied. Surprisingly, the exposure tolerance becomes progressively less as the thickness of the layer R decreases (1.0 mm–0.8 mm–0.5 mm), and at the last of these three figures becomes critical, which can easily result in unsatisfactory relief images and in complaints or claims. The age of the photocrosslinkable mixtures used for the relief-forming layer, and the conditions under which they have been stored prior to imagewise exposure, can also have an adverse effect on the permissible exposure tolerance for achieving satisfactory relief images.

It is the object of the present invention to improve the exposure tolerance in the conventional process for the production of photopolymer relief plates by imagewise exposure of a photocrosslinkable layer, which has been applied to a base bearing an adhesive layer, and subsequent removal of the unexposed areas of the layer, without such improvement requiring a change in the polymers and/or monomers in the photocrosslinkable layer or a change in the chosen relief heights of the plates, and without having to increase the exposure time.

We have found that this object is achieved by a process for the production of photopolymer relief plates by applying a photosensitive relief-forming layer R of a mixture comprising a photopolymerizable ethylenically unsaturated compound and a photoinitiator to a dimensionally stable base which bears an adhesive layer A for the layer R, exposing the layer R imagewise and subsequently removing the unexposed areas of the layer, wherein a layer R, containing from 0.00001 to 5 percent by weight of a polymerization inhibitor which on ultraviolet irradiation liberates nitrosyl free radicals, is applied to an adhesive layer A, which contains from 0.01 to 10 percent by weight of a compound

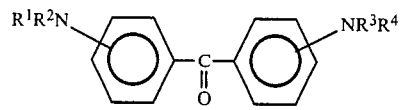

where $R^1$, $R^2$, $R^3$ and $R^4$ are identical or different and each is alkyl or $R^5$—(O-alkylene)$_x$—, $R^5$ being H or alkyl and x being 1, 2, 3, 4 or 5.

The present invention relates not only to the above process but also to the relief plates produced by the process.

Suitable mixtures comprising a photopolymerizable ethylenically unsaturated compound and a photoinitiator, for producing the relief-forming layer, are the conventional ethylenically unsaturated monomers, containing a photoinitiator, employed for photopolymer printing plates, as well as mixtures which contain such monomers and unsaturated and/or saturated polymeric binders. The process according to the invention is particularly suitable for liquid mixtures of photoinitiator-containing monomer/polymer mixtures and especially for mixtures which can be developed with aqueous alkali, such as are described in German Laid-Open Applications DOS Nos. 2,040,390 and 2,659,699. Of the linear or branched polyesters prepared by reacting unsaturated dibasic carboxylic acids, with or without unsaturated polybasic carboxylic acids, and with or without saturated dibasic and/or polybasic carboxylic acids, with dialcohols, with or without polyalcohols, those which have a relatively high acid number, especially of from 75 to 160, are preferred, since they result in good dispersibility or solubility of the compositions in aqueous alkaline developer solutions. As regards the composition and preparation of unsaturated polyester resins, reference may be made to the available literature, for example to the book by H. V. Boenig, Unsaturated Polyesters, Structure and Properties, Amsterdam 1964.

The quantity of polymeric binder in the mixture is in general from about 45 to 90 percent by weight and especially from 45 to 65 percent by weight, based on the amount of polymer plus photopolymerizable monomers.

Suitable photopolymerizable, ethylenically unsaturated compounds for use in the layer R are, in particular, low molecular weight compounds having one or more ethylenically unsaturated photopolymerizable double bonds, provided they form compatible mixtures with the particular polymeric binders chosen, and provided they boil above 100° C. under atmospheric pressure. Preferred monomers are those with two or more ethylenically unsaturated photopolymerizable double bonds, these being used by themselves or mixed with monomers having only one ethylenically unsaturated photopolymerizable double bond. The type of the monomers employed depends substantially on the type of the polymeric binder used. Thus, in the case of mixtures with unsaturated polyester resins, particularly suitable monomers are allyl compounds containing two or more double bonds, such as diallyl maleate, allyl acrylate, diallyl phthalate, diallyl trimellitate, triallyl trimellitate and ethylene glycol bis-allylcarbonate, as well as diacrylates, polyacrylates, dimethacrylates and polymethacrylates obtainable by esterifying diols or polyols with acrylic acid or methacrylic acid, such as the diacrylates, triacrylates, dimethacrylates and trimethacrylates of ethylene glycol, diethylene glycol, triethylene glycol, polyethylene glycol of molecular weight up to about 800, propane-1,2-diol, propane-1,3-diol, neopentyl glycol(2,2-dimethylpropanediol), butane-1,4-diol, 1,1,1-trimethylolpropane, glycerol or pentaerythritcol, as well as the monoacrylates and monomethacrylates of these diols and polyols, for example ethylene glycol monoacrylate, diethylene glycol monoacrylate, triethylene glycol monoacrylate and tetraethylene glycol monoacrylate, and monomers with two or more olefinically unsaturated bonds, which contain urethane groups and/or amide groups, such as the low molecular weight compounds prepared from aliphatic diols of the above type, organic diisocyanates and hydroxyalkyl acrylates or methacrylates. Further suitable monomers are acrylic acid, methacrylic acid and their derivatives, such as acrylamide, methacrylamide, N-hydroxymethylacrylamide, N-hydroxymethyl-methacrylamide and acrylates and methacrylates of monoalcohols of 1 to 6 carbon atoms. Mixtures of allyl monomers with diacrylates or polyacrylates are very suitable.

The amount of monomer or monomers is preferably from about 10 to 55, and especially from 35 to 55, percent by weight, based on the amount of polymer plus photopolymerizable monomers, and is determined, inter alia, by the compatibility of the monomers with the polymer and by the desired hardness of the relief plate obtained. Particularly suitable mixtures contain from 45 to 75 percent by weight of an unsaturated polyester having an acid number of from 100 to 150, from 15 to 25, and especially from 10 to 20 percent by weight of a monomer with two carbon-carbon double bonds, at least one of which is an allyl group, from 5 to 25 percent by weight of a monomer containing one or more acrylate or methacrylate groups, from 1 to 10 percent by weight of a low molecular weight compound containing one or more amide groups, from 0.2 to 4 percent by weight of a photoinitiator and less than 1 percent by weight of a thermal polymerization inhibitor.

The layer R contains, as is usual, from 0.01 to 10, and especially from 0.01 to 3, percent by weight, based on the above mixture, of a photoinitiator. Virtually any compound which on exposure to actinic light forms free radicals capable of initiating a polymerization can be used as the photoinitiator. Examples of suitable photoinitiators are acyloins and acyloin-ethers, aromatic diketones and their derivatives, polynuclear quinones, acridine derivatives and phenazine derivatives. Particularly suitable compounds are benzoin and α-hydroxymethyl-benzoin and their alkyl ethers, alkyl being of 1 to 8 carbon atoms, eg. benzoin isopropyl ether, α-hydroxymethyl-benzoin methyl ether, benzoin tetrapyranyl ether and benzoin methyl ether, and benzil monoketals, eg. benzil monomethylbenzyl ketal or benzil mononeopentyl ketal.

According to the invention, the mixture used in the relief-forming layer R contains from 0.00001 to 5, and especially from 0.0001 to 3, percent by weight of a thermal polymerization inhibitor which on ultraviolet irradiation liberates nitrosyl free radicals. Particularly suitable inhibitors of this type are the nitrosamines mentioned in German Published Application DAS No. 2,437,632, and especially N-nitrosodiphenylamine.

The mixtures used in layer R can also contain other conventional additives, such as plasticizers, saturated low molecular weight compounds possessing amide groups, waxes, etc.

The processing of the photopolymerizable mixtures into recording elements, which contain the mixtures as relief-forming layers R which are, in general, from 0.2 to 3 mm, especially from 0.4 to 1.5 mm, thick may be effected in a conventional manner, depending on the nature of the mixture. Liquid mixtures can be applied by means of a doctor blade to the base bearing the adhesive layer A.

Suitable dimensionally stable bases are those conventionally used as substrates in the production of relief printing plates, such as steel or aluminum base plates, or tough plastic films, such as polyester, polyvinyl chloride or cellulose films, which bases are provided with an adhesive layer A for the layer R. Bases with suitable adhesive layers are in particular those described in German Laid-Open Applications DOS Nos. 1,597,515, 2,414,596 and 2,415,728. Adhesives which have proved very suitable for the adhesive layer include polyurethane adhesives and in particular pigmented polyurethane adhesives, which contain, in addition to hydroxyl-containing oligomers or polymers such as hydroxyl-containing polyesters or epoxy resins, a polyisocyanate, preferably in excess, and which react, in the presence or absence of a catalyst for polyurethane formation, during or after application, preferably on heating the base bearing the adhesive layer, reaction being accompanied by crosslinking. Suitable hydroxyl-containing polyesters are those mentioned in German Laid-Open Application DOS No. 1,597,515. Advantageously, the layer A also contains an unsaturated monomer, such as glycidyl acrylate or methacrylate, or an acrylic derivative of an epoxy resin.

We have found that it is frequently advantageous first to apply an adhesion-promoting layer to the base, which layer in particular serves to ensure adhesion to the base, and then to apply thereto the adhesive layer A proper which particularly serves to ensure adhesion of the relief-forming layer R, ie. which is often chemically similar to the binder in layer R. The nature of the binders or binder-forming constituents and of the other constituents of the adhesive layer A depends on the type of base and the nature of the mixture present in the layer R, and forms no part of the present invention.

However, it is essential, for the purposes of the invention, that the adhesive layer A, or, where two layers are applied to the base, at least the adhesive layer A which faces the layer R, contains from 0.01 to 10, especially from 0.2 to 2.0, percent by weight of a compound of the formula

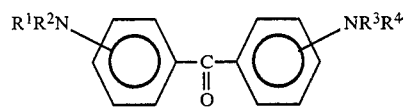

where $R^1$, $R^2$, $R^3$ and $R^4$ are identical or different and each is alkyl or $R^5$—(O-alkylene)$_x$—, $R^5$ being H or alkyl and x being 1, 2, 3, 4 or 5. Accordingly, the adhesive layer A must always contain Michler's ketone or a N-substituted diaminobenzophenone of very similar structure. The use of Michler's ketone is preferred, but the corresponding ethylene oxide reaction products of diaminobenzophenone have also proved suitable.

The adhesive layer A which faces the layer R can be applied to the base in a conventional manner, for example by means of a doctor blade or by lamination, and is then preferably dried, with or without heating, before the layer R is applied. In general, the thickness of the dried adhesive layer A is from 0.005 to 0.150 mm and especially from 0.015 to 0.04 mm. The processing of the blank material into relief plates is carried out in a conventional manner by imagewise exposure to actinic light, using light sources which have emission maxima in the absorption range of the photoinitiators, in general in the range from 300 to 400 nm, or which emit light which contains a sufficient proportion in this wavelength range, such as medium-pressure mercury vapor lamps, as well as high-pressure and low-pressure mercury vapor lamps and superactinic fluorescent tubes. After imagewise exposure, the unexposed areas of the layer are mechanically removed in a conventional manner or, preferably, washed out with developer solutions and the resulting printing plates are dried and, in some cases, advantageously post-exposed. As regards the processing of liquid mixtures for the layer R, particular reference may be made to German Laid-Open Application DOS No. 2,408,748.

The process according to the invention is distinguished by the fact that relief plates exhibiting a good relief image can be produced with a larger exposure tolerance. Furthermore, the novel process makes possible the processing of mixtures which have been stored for some time and which normally could not be processed in the conventional manner into relief plates having a satisfactory relief image, without additional expense.

In the Examples and Comparative Experiments which follow parts are by weight unless stated otherwise.

EXAMPLE 1

1.1. Preparation of the adhesive 24 parts of a polyester obtained from 2.5 moles of adipic acid, 0.5 mole of phthalic acid and 4 moles of 1,1,1-trimethylolpropane, and having an OH content of 8.8 percent by weight, are mixed with 21 parts of rutile, 7 parts of lead chromate pigment, 16 parts of xylene and 32 parts of butylacetate. 45 parts of this mixture (a) are mixed with (b) 15 parts of the reaction product of 1 mole of the diglycidyl ether of 2,2-bis-(4-hydroxyphenyl)-propane and 2 moles of acrylic acid in 4 parts of toluene, (c) 18 parts of 1.93 percent strength by weight solution of Michler's ketone (MK) in 35 parts of xylene and 65 parts of butyl acetate and (d) 18 parts of a 67 percent strength by weight solution of a commercial reaction product of 1 mole of 1,1,1-trimethylolpropane with 3 moles of toluylene diisocyanate in equal parts of xylene and ethyl glycol acetate, to give an adhesive.

1.2 Application of the adhesive layer A to the base

The adhesive is applied to degreased steel base plates in such a thickness that after the solvent has evaporated off in air at room temperature and the base has then been heated for 2 minutes at 220° C., a layer A which is 15–20 μm thick remains on the base.

1.3 Application of the relief-forming layer R

The application of the layer R to the base coated with adhesive, and the exposure of the resulting element are carried out as described in German Laid-Open Application DOS No. 2,408,748. A freshly prepared mixture of 54 percent by weight of an unsatured polyester obtained from fumaric acid, trimellitic anhydride and diethylene glycol and having an acid number of 143, 46 percent by weight of a mixture of diallyl phthalate, methacrylamide and polyethylene glycol dimethacrylate, 0.7 percent by weight of benzoin methyl ether and 145 ppm of N-nitrosodiphenylamine is applied in various thicknesses corresponding to the relief heights of the finished plates, namely 0.5 mm (Example 1A)
0.8 mm (Example 1B) and
1.0 mm (Example 1C).

1.4 Processing into relief plates

The layer R is exposed imagewise through a negative. The unexposed areas of the printing plate are then washed out with an aqueous alkaline solution. The shortest exposure time required to produce a relief having firmly supported fine lines and halftone dots, and the longest exposure time required to produce adequate shadow dot depth are then ascertained for the individual plates. The difference between these exposure times serves as a basis for assessing the quality of the relief image. The results are given as a percentage difference, based on the shortest exposure time. If the figure found is positive, it means that there is a certain tolerance in respect of the exposure time which gives satisfactory results. If the figure is negative, it means that the printing plates cannot be used.

| Relief height (mm) | 0.5 (1A) | 0.8 (1B) | 1.0 (1C) |
| --- | --- | --- | --- |
| | +160% | +350% | +500% |

EXAMPLE 2

The procedure followed is exactly as described in Example 1, except that in place of a 1.93% strength solution of Michler's ketone (MK) a 0.8% strength solution is used in adhesive component (c)) (see 1.1).

| Relief height (mm) | 0.5 (2A) | 0.8 (2B) | 1.0 (2C) |
| --- | --- | --- | --- |
| | +25% | +105% | +140% |

COMPARATIVE EXPERIMENT 1 (V1)

The procedure followed is exactly as described in Example 1, except that the adhesive component (c) does not contain any Michler's ketone

| Relief height (mm) | 0.5 (V1A) | 0.8 (V1B) | 1.0 (V1C) |
| --- | --- | --- | --- |
| | 45% | 15% | ±0 |

EXAMPLE 3

The procedure followed is exactly as described in Example 1, but in place of the freshly prepared mixture used in 1.3, a mixture of the same type which has been stored for 6 months is used to produce layer R.

| Relief height (mm) | 0.5 (3A) | 0.8 (3B) | 1.0 (3C) |
| --- | --- | --- | --- |
| | 10% | +25% | +60% |

EXAMPLE 4

The procedure followed is exactly as described in Example 2, but in place of the freshly prepared mixture used in 1.3, a mixture of the same type which has been stored for 6 months is used to produce layer R.

| Relief height (mm) | 0.5 (4A) | 0.8 (4B) | 1.0 (4C) |
|---|---|---|---|
| | −200% | −60% | +15% |

COMPARATIVE EXPERIMENT 2 (V2)

The procedure followed is exactly as described in Comparative Experiment 1 (V1), but in place of the freshly prepared mixture used in 1.3, a mixture of the same type which has been stored for 6 months is used to produce layer R.

| Relief height (mm) | 0.5 (V2A) | 0.8 (V2B) | 1.0 (V2C) |
|---|---|---|---|
| | −400% | −400% | −350% |

We claim:

1. A process for the production of photopolymer relief plates which comprises applying a photosensitive relief-forming layer R of a mixture comprising a photopolymerizable ethylenically unsaturated compound and a photoinitiator to a dimensionally stable base which bears an adhesive layer A for the layer R, exposing the layer R imagewise to actinic light of a wavelength range of from 300 to 400 nm and subsequently removing the unexpected areas of the layer, wherein a layer R, containing from 0.0001 to 3 percent by weight of a thermal polymerization inhibitor which on ultraviolet irradiation liberates nitrosyl free radicals is applied to an adhesive layer A, which contains from 0.01 to 10 percent by weight of a compound

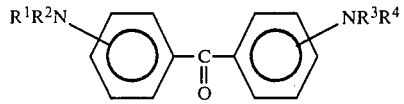

where $R^1$, $R^2$, $R^3$ and $R^4$ are identical or different and each is alkyl or $R^5$—(O-alkylene)$_x$—, $R^5$ being H or alkyl and x being 1, 2, 3, 4 or 5.

2. The process of claim 1, wherein the layer R contains N-nitrosodiphenylamine.

3. The process of claim 1, wherein the adhesive layer A contains Michler's ketone.

4. The process of claim 1, wherein a layer R which is liquid at room temperature is applied.

5. The process of claim 1, wherein the layer R contains an unsaturated polyester with carboxyl groups and at last one photopolymerizable ethylenically unsaturated monomer.

6. The process of claim 1, wherein the adhesive layer A contains a polyester polyurethane as binder.

7. The process of claim 1, wherein the adhesive layer A is prepared by drying a pigmented or unpigmented adhesive at from 130° to 240° C.

8. The process of claim 1, wherein the adhesive layer A has a thickness of from 0.002 to 0.150 mm.

9. The process of claim 1, wherein the relief-forming layer R has a thickness of from 0.2 to 3 mm.

* * * * *